US006847544B1

(12) United States Patent
Smith et al.

(10) Patent No.: US 6,847,544 B1
(45) Date of Patent: Jan. 25, 2005

(54) MAGNETIC MEMORY WHICH DETECTS CHANGES BETWEEN FIRST AND SECOND RESISTIVE STATES OF MEMORY CELL

(75) Inventors: Kenneth Kay Smith, Boise, ID (US); Frederick A. Perner, Palo Alto, CA (US); Richard Lee Hilton, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 24 days.

(21) Appl. No.: 10/689,144

(22) Filed: Oct. 20, 2003

(51) Int. Cl.$^7$ ............................................. G11C 11/00
(52) U.S. Cl. ...................................... 365/158; 365/209
(58) Field of Search ............................... 365/158, 171, 365/173, 209, 210

(56) References Cited

U.S. PATENT DOCUMENTS

| | | |
|---|---|---|
| 6,111,783 A | 8/2000 | Tran et al. |
| 6,185,143 B1 | 2/2001 | Perner et al. |
| 6,256,247 B1 | 7/2001 | Perner |
| 2003/0103377 A1 * | 6/2003 | Kajiyama .................. 365/157 |

* cited by examiner

Primary Examiner—Son Mai

(57) ABSTRACT

A magnetic memory which detects changes between resistive states of a memory cell is disclosed. In one embodiment the magnetic memory includes a memory cell which has first and second resistive states. First and second write conductors are configured to conduct first and second currents to change the memory cell between the first and the second resistive states. The first and the second write conductors are routed in first and second directions and intersect the memory cell. First and second sense conductors are configured to conduct a sense current through the memory cell. A sense circuit coupled to the second sense conductor is configured to detect the change between the first and the second resistive states.

31 Claims, 6 Drawing Sheets

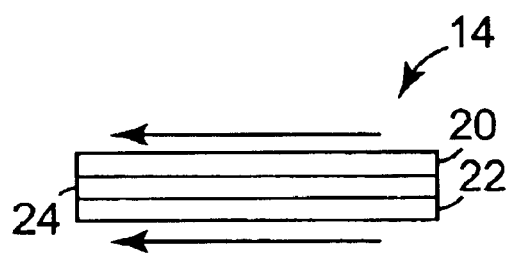
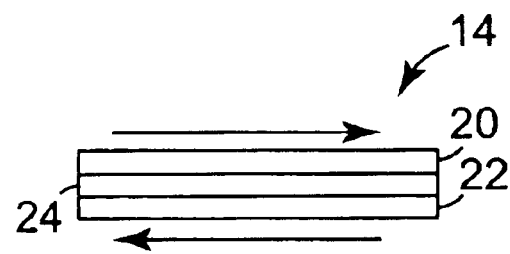
Fig. 2A  Fig. 2B
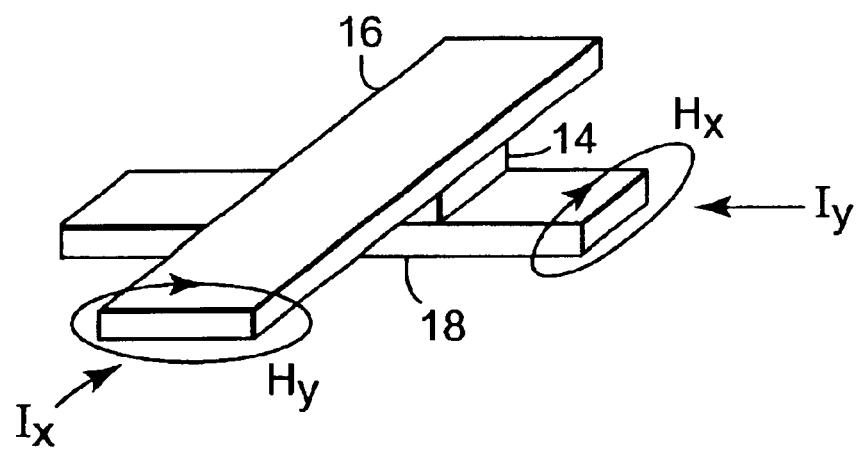
Fig. 3

MAGNETIC MEMORY WHICH DETECTS CHANGES BETWEEN FIRST AND SECOND RESISTIVE STATES OF MEMORY CELL

BACKGROUND OF THE INVENTION

Magnetic random access memory (MRAM) is a type of non-volatile magnetic memory which includes magnetic memory cells. A typical magnetic memory cell includes a layer of magnetic film in which the magnetization of the magnetic film is alterable and a layer of magnetic film in which magnetization is fixed or "pinned" in a particular direction. The magnetic film having alterable magnetization is typically referred to as a data storage layer, and the magnetic film which is pinned is typically referred to as a reference layer.

A typical magnetic memory includes an array of magnetic memory cells. Word lines extend along rows of the magnetic memory cells, and bit lines extend along columns of the magnetic memory cells. Each magnetic memory cell is located at an intersection of a word line and a bit line. A magnetic memory cell is usually written to a desired logic state by applying external magnetic fields that rotate the orientation of magnetization in its data storage layer. The logic state of a magnetic memory cell is indicated by its resistance state which depends on the relative orientations of magnetization in its data storage and reference layers. A sense amplifier is used to sense the resistance state of a selected magnetic memory cell to determine the logic state stored in the memory cell.

Writing magnetic memory cells to a desired logic state can be unreliable. Manufacturing variations in the dimensions or shapes or in the thicknesses or crystalline anisotropy of the data storage layers of the magnetic memory cells can cause variations across a wafer in the critical switching fields necessary to reliably write selected magnetic memory cells without writing half-selected magnetic memory cells.

Changes in ambient temperature can cause the temperature of the magnetic memory cells to vary which in turn causes the coercivity of the magnetic memory cells to change. The coercivity decreases with increasing temperature resulting in a decrease in the critical switching field. Increasing temperatures can increase the likelihood that either the bit line write field or the word line write field will be high enough to cause half-select switching of magnetic memory cells. Conversely, decreasing temperatures can increase the likelihood that the sum of the bit line write field and the word line write field will not be higher than the critical switching field.

To offset the manufacturing variations and temperature variations, the word and bit line electrical currents can be chosen to have values that are higher than those required under nominal conditions so that the critical switching fields can be reached. This approach can result in unnecessary power consumption by the magnetic memory, especially when the ambient temperature is increased.

SUMMARY OF THE INVENTION

The present invention provides a magnetic memory which detects changes between resistive states of a memory cell. One embodiment of the present invention provides a magnetic memory which includes a memory cell which has first and second resistive states. First and second write conductors are configured to conduct first and second currents to change the memory cell between the first and the second resistive states. The first and the second write conductors are routed in first and second directions and intersect the memory cell. First and second sense conductors are configured to conduct a sense current through the memory cell. A sense circuit coupled to the second sense conductor is configured to detect the change between the first and the second resistive states.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIGS. 2A and 2B are diagrams illustrating parallel and anti-parallel magnetization of a magnetic memory cell.

FIG. 3 is a diagram illustrating a magnetic memory cell that has been selected during a write operation.

DETAILED DESCRIPTION

Figure 1:
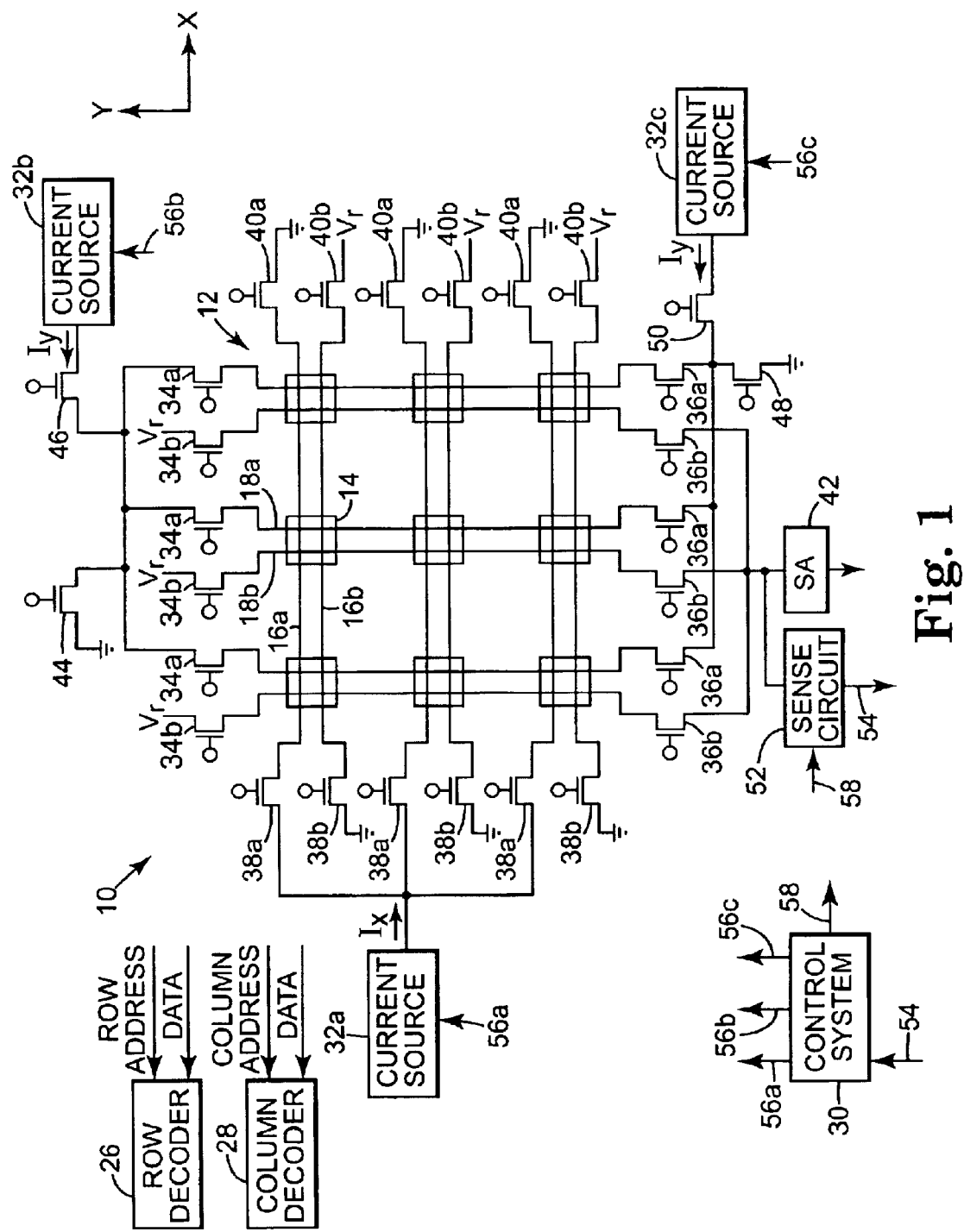
FIG. 1 is a diagram illustrating one exemplary embodiment of a magnetic memory according to the present invention.

FIG. 1 is a diagram illustrating one exemplary embodiment of a magnetic memory 10 according to the present invention. Magnetic memory 10 optimizes write currents to improve reliability of write operations while minimizing power consumption.

The magnetic memory cells 14 illustrated in FIG. 1 are arranged in rows and columns, with the rows extending along an x-direction and the columns extending along a y-direction. Only a relatively small number of magnetic memory cells 14 are shown to simplify the description of the invention. In other embodiments, the array 12 is any suitable size.

In the exemplary embodiment, first write conductors or word write lines 16a are routed in a first direction along the x-direction in a plane on one side of array 12 and intersect the memory cells 14. Word write lines 16a are configured to conduct first currents or word write line currents. Second write conductors or bit write lines 18a are routed in a second direction along the y-direction in a plane on an adjacent side of array 12 and intersect the memory cells 14. Bit write lines 18a are configured to conduct second currents or bit write line currents. The first or second currents change the memory cell between the first and second resistive states.

First sense conductors or word sense lines 16b are routed in a first direction extend along the x-direction in a plane on one side of array 12. Second sense conductors or bit sense lines 18b are routed in a second direction along the y-direction in a plane on an opposite side of array 12. In one embodiment, first sense conductors 16b and second sense conductors 18b intersect the memory cells 14.

In the exemplary embodiment, each adjacent first write conductor 16a and first sense conductor 16b are termed a word line conductor pair 16. Each adjacent second write conductor 18a and second sense conductor 18b are termed a bit line conductor pair 18. In one embodiment, word line conductor pairs 16 and bit line conductor pairs 18 intersect the memory cells 14.

In one embodiment, magnetic memory 10 is manufactured so that each adjacent first write conductor 16a and first sense conductor 16b are physically routed to overlap intersected memory cells 14. Each adjacent second write: conductor 18a and second sense conductor 18b are physically routed to overlap intersected memory cells 14. In one embodiment, magnetic memory 10 is manufactured so that each first write conductor 16a and second write conductor 18a are physically routed to be in close proximity to intersected memory cells 14. Each first sense conductor 16b and second sense conductor 18b are physically routed to overlap intersected memory cells 14. In other embodiments, magnetic memory 10 is manufactured using other suitable approaches of intersecting memory cells 14 with first write conductors 16a, first sense conductors 16b, second write conductors 18a and second sense conductors 18b.

The magnetic memory cells 14 are not limited to any particular type of device. Magnetic memory cells 14 may be, for example, spin dependent tunneling junction devices, anisotropic magnetoresistance devices, giant magnetoresistance devices, colossal magnetoresistance devices, extraordinary magnetoresistance devices or very large magnetoresistance devices.

In the exemplary embodiment, magnetic memory 10 includes a row decoder 26, a column decoder 28 and a control system 30. Control system 30 is coupled to row decoder 26 and controls row decoder 26 during read and write operations. Row decoder 26 is coupled to the gates of switching transistors 38 and switching transistors 40, and opens and closes switching transistors 38 and switching transistors 40 in accordance with instructions received from control system 30.

Control system 30 is coupled to column decoder 28 and controls column decoder 28 during read and write operations. Column decoder 28 is coupled to the gates of switching transistors 34 and switching transistors 36, and opens and closes switching transistors 34 and switching transistors 36 in accordance with instructions received from control system 30.

During a read operation, switching transistors 40b selectively couple one end of first sense conductors 16b to a read voltage source $V_r$. For first sense conductors 16b which are not selectively coupled to the read voltage source $V_r$, switching transistors 38b selectively couple the other end of the first sense conductors 16b to ground. Switching transistors 36b selectively couple one end of second sense conductors 18b to sense amplifier 42. For second sense conductors 18b which are not selectively coupled to sense amplifier 42, switching transistors 34b selectively couple the other end of the second sense conductors 18b to ground.

During a write operation, to supply a word write line current, switching transistors 38a selectively couple first write conductors 16a to current source 32a which provides a first current or word write line current $I_x$. Switching transistors 40a selectively couple first write conductors 16a to ground. To supply a bit write line current in a first direction, switching transistors 34a and switching transistor 46 selectively couple a first end of second write conductors 18a to current source 32b which provides a second current or bit write line current $I_y$ in the first direction. Switching transistors 36a and switching transistor 48 selectively couple a second end of the second write conductors 18a to ground. To supply a bit write line current in a second direction, switching transistors 36a and switching transistor 50 selectively couple the second end of second write conductors 18a to current source 32c which provides the second current or bit write line current $I_y$ in the second direction. Switching transistors 34a and switching transistor 44 selectively couple the first end of second write conductors 18a to ground.

In the exemplary embodiment, memory cells 14 each have first and second resistive states. The first and second resistive states correspond to first and second logic states or values stored by memory cells 14. The first and second logic states correspond, respectively, to logic "0" and logic "1" values, or to logic "1" and logic "0" values.

The first and second logic states correspond to parallel and anti-parallel logic states, or to anti-parallel and parallel logic states. The magnetic fields $H_y$ and $H_x$ generated by the write currents 11 and ly respectively, combine to change the binary state of memory cells 14 from either a parallel to an anti-parallel logic state, or from an anti-parallel to a parallel logic state.

In a first embodiment to illustrate writing magnetic memory cells 14, the first current $I_x$ is supplied from current source 32a to selected first write conductors 16a. To write a logical "0", the column write current $I_y$ is supplied from current source 32b, and to write a logical "1", the column write current $I_y$ is supplied from current source 32c.

In a second embodiment to illustrate writing magnetic memory cell 14, the first current $I_x$ is supplied from current source 32a to selected first write conductors 16a. To write a logical "1", the column write current $I_y$ is supplied from current source 32b, and to write a logical "0", the column write current $I_y$ is supplied from current source 32c.

In the exemplary embodiment of detecting a change between the first and the second resistive states of a memory cell 14 during a write operation, a sense circuit 52 is coupled to second sense conductors 18b and is configured to detect a change between the first and the second resistive states of a memory cells 14 when the memory cell 14 is being written. The change between the first and the second resistive states of the memory cell 14 is detected by conducting a first current through a first write conductor 16a and conducting a second current through a second write conductor 18a and detecting a change in a sense current conducted by a first sense conductor 16b and a second sense conductor 18b through the memory cell 14. The sense current is conducted to sense circuit 52. Sense circuit 52 provides an indication at an output 54 if a change in the sense current through the memory cell 14 is detected.

Only one sense circuit 52 is illustrated in FIG. 1 to monitor a change in a memory cell 14 between the first and second resistive states. In other embodiments, two or more memory cells 14 are written at the same time and two or more corresponding sense circuits 52 are included to monitor the change between the first and second resistive states of the two or more memory cells 14. In these embodiments, each of the memory cells 14 is coupled to a sense circuit 52 through a corresponding second sense conductor 18b.

In various embodiments, the first and second currents can be increased or reduced using any suitable approach. In one embodiment, the first current or the second current can be incrementally increased using a step approach wherein a suitable time is provided between steps to allow the memory cells 14 to change between the first and second resistive states. In one embodiment, the first current or the second current can be increased continuously as a function of time.

In various embodiments, the current sources 32 which supply the first and second currents can be located within magnetic memory 10 or located external to magnetic memory 10. The current sources 32 can use any suitable approach to supply the first and second currents. In one embodiment, the first or second currents can be supplied or controlled by charge stored in one or more capacitors located either within or external to magnetic memory 10.

In a first exemplary embodiment of detecting a change between the first and second resistive states of a memory cell 14 during a write operation, control system 30 sets the first current at a constant level and increases the second current until sense circuit 52 provides the indication at output 54 that memory cell 14 has changed between the first and the second resistive states. After the indication is received, control system 30 decreases the first current and the second current. In one embodiment, the first current and the second current are reduced to zero amperes.

In a second exemplary embodiment of detecting a change between the first and second resistive states of a memory cell 14 during a write operation, control system 30 sets the second current at a constant level and increases the first current until sense circuit 52 provides the indication at output 54 that memory cell 14 has changed between the first and the second resistive states. After the indication is received, control system 30 decreases the first current and the second current. In one embodiment, the first current and the second current are reduced to zero amperes.

In a third exemplary embodiment of detecting a change between the first and second resistive states of a memory cell 14 during a write operation, control system 30 increases both the first and the second current until sense circuit 52 provides the indication at output 54 that memory cell 14 has changed between the first and the second resistive states. After the indication is received, control system 30 decreases the first current and the second current. In one embodiment, the first current and the second current are reduced to zero amperes.

In a first exemplary embodiment of detecting a change between the first and second resistive states of a first and second memory cell 14 during a write operation, control system 30 sets the first current conducted via a first write conductor 16a at a constant level. The write conductor 16a intersects a first and second memory cell 14. Control system 30 increases a second current conducted by a second write conductor 18a which intersects the first memory cell 14 until a first sense circuit 52 provides an indication that first memory cell 14 has changed between the first and the second resistive states. After the indication is received from the first sense circuit 52, control system 30 reduces the second current conducted through the second write conductor 18a which intersects the first memory cell 14. In one embodiment, the second current is reduced to zero amperes.

In the first exemplary embodiment, the control system 30 increases a second current conducted by a second write conductor 18a which intersects the second memory cell 14 until a second sense circuit 52 provides an indication that the second memory cell 14 has changed between the first and the second resistive states. After the indication is received from the second sense circuit 52, the control system 30 reduces the second current conducted through the second write conductor 18a which intersects the second memory cell 14. In one embodiment, the second current is reduced to zero amperes. Control system 30 reduces the first current conducted via the first write conductor 16a after the first and second sense circuits 52 both provide the indication that first and second memory cells 14 have changed between the first and the second resistive states.

In a second exemplary embodiment of detecting a change between the first and second resistive states of a first and second memory cell 14 during a write operation, control system 30 sets second currents conducted by a second write conductor 18a which intersects the first memory cell 14 and a second write conductor 18a which intersects the second memory cell 14 at a constant level. Control system 30 increases a first current conducted via the first write conductor 16a which intersects the first and second memory cells 14. When the first sense circuit 52 provides an indication that the first memory cell 14 has changed between the first and the second resistive states, control system 30 reduces the second current conducted by the second write conductor 18a which intersects the first memory cell 14. In one embodiment, this second current is reduced to zero amperes.

In the second exemplary embodiment, when the second sense circuit 52 provides an indication that the second memory cell 14 has changed between the first and the second resistive states, control system 30 reduces the second current conducted by the second write conductor 18a which intersects the second memory cell 14. In one embodiment, this second current is reduced to zero amperes. Control system 30 reduces the first current conducted via the first write conductor 16a after both the first and second sense circuits 52 provide the indication that first and second memory cells 14 have changed between the first and the second resistive states. In one embodiment, the first current is reduced to zero amperes.

In a third exemplary embodiment of detecting a change between the first and second resistive states of a first and second memory cell 14 during a write operation, control system 30 increases a first current conducted via a first write conductor 16a. The write conductor 16a intersects first and second memory cells 14. Control system 30 increases a second current conducted by a second write conductor 18a which intersects the first memory cell 14 until a first sense circuit 52 provides an indication that first memory cell 14 has changed between the first and the second resistive states. After the indication is received from first sense circuit 52, control system 30 reduces the second current conducted through the second write conductor 18a which intersects the first memory cell 14. In one embodiment, the second current is reduced to zero amperes.

In the third exemplary embodiment, control system 30 increases a second current conducted by a second write conductor 18a which intersects the second memory cell 14 until a second sense circuit 52 provides an indication that second memory cell 14 has changed between the first and the second resistive states. After the indication is received from the second sense circuit 52, control system 30 reduces the second current conducted through the second write conductor 18a which intersects the second memory cell 14. In one embodiment, the second current is reduced to zero amperes. Control system 30 reduces the first current conducted via the first write conductor 16a after the first and second sense circuits 52 both provide the indication that first and second memory cells 14 have changed between the first and the second resistive states.

FIGS. 2A and 2B are diagrams illustrating parallel and anti-parallel magnetization of a magnetic memory cell. In one embodiment, magnetic memory cell 14 is a spin dependent tunneling device. Magnetic memory cell 14 includes a magnetic layer referred to as data storage layer 20, a magnetic layer referred to as reference layer 22, and a tunnel barrier 24 disposed between data storage layer 20 and reference layer 22. Data storage layer 20 is referred to as a free layer because it has a magnetization orientation that is not pinned and which can be oriented in either of two directions along an easy axis which lies in a plane. Reference layer 22 is referred to as a pinned layer because it has a magnetization that is oriented in a plane but is fixed so as not to rotate in the presence of an applied magnetic field within a range of interest. The magnetization orientation assumes one of two stable orientations at any given time which are the parallel and anti-parallel orientations.

FIG. 2A illustrates by arrows the parallel orientation when the magnetization of the free and pinned layers 20 and 22 are in the same direction along the easy axis. With parallel orientation, the orientation of magnetization in the data storage layer 20 is substantially parallel to the magnetization in the reference layer 22 along the easy axis and magnetic memory cell 14 is in a low resistance state which can be represented by the value R. FIG. 2B illustrates by arrows the anti-parallel orientation when the magnetization of the free and pinned layers 20 and 22 are in opposite directions. With anti-parallel orientation, the orientation of magnetization in the data storage layer 20 is substantially anti-parallel to the magnetization in the reference layer 22 along the easy axis and magnetic memory cell 14 is in a high resistance state which can be represented by the value R+ΔR. The insulating tunnel barrier 24 allows quantum mechanical tunneling to occur between the free and pinned layers 20 and 22. Because the tunneling is electron spin dependent, the resistance of magnetic memory cell 14 is a function of the relative orientations of the magnetization of the free and pinned layers 20 and 22.

Data is stored in magnetic memory cell 14 by orienting the magnetization along the easy axis of free layer 20. In one embodiment, a logic value of "0" is stored in magnetic memory cell 14 by orienting the magnetization of free layer 20 such that the magnetization orientation is parallel, and a logic value of "1" is stored in magnetic memory cell 14 by orienting the magnetization of free layer 20 such that the magnetization orientation is anti-parallel. In another embodiment, a logic value of "1" is stored in magnetic memory cell 14 by orienting the magnetization of free layer 20 such that the magnetization orientation is parallel, and a logic value of "0" is stored in magnetic memory cell 14 by orienting the magnetization of free layer 20 such that the magnetization orientation is anti-parallel.

FIG. 3 is a diagram illustrating a magnetic memory cell 14 that has been selected. In one embodiment, the magnetization in free layer 20 of selected magnetic memory cell 14 is oriented by supplying the currents Ix and Iy to conductors 16 and 18 which cross selected magnetic memory cell 14. Supplying the current Ix to word line 16 causes a magnetic field Hy to form around conductor 16. Supplying the current Iy to bit line 18 causes a magnetic field Hx to form around bit line 18. When sufficiently large currents Ix and Iy are passed through word line 16 and bit line 18, the magnetic fields Hx and Hy in the vicinity of free layer 20 cause the magnetization of free layer 20 to rotate from the parallel orientation to the anti-parallel orientation, or to rotate from the antiparallel orientation to the parallel orientation.

In one embodiment, a magnetic memory cell 14 is read by applying sense currents to word line 16 and bit line 18. Magnetic memory cell 14 will have either a resistance of R or a resistance of R+ΔR, depending on whether the orientation of magnetization of the free and pinned layers 20 and 22 is parallel or anti-parallel as illustrated in FIGS. 2A and 2B.

Figure 4:
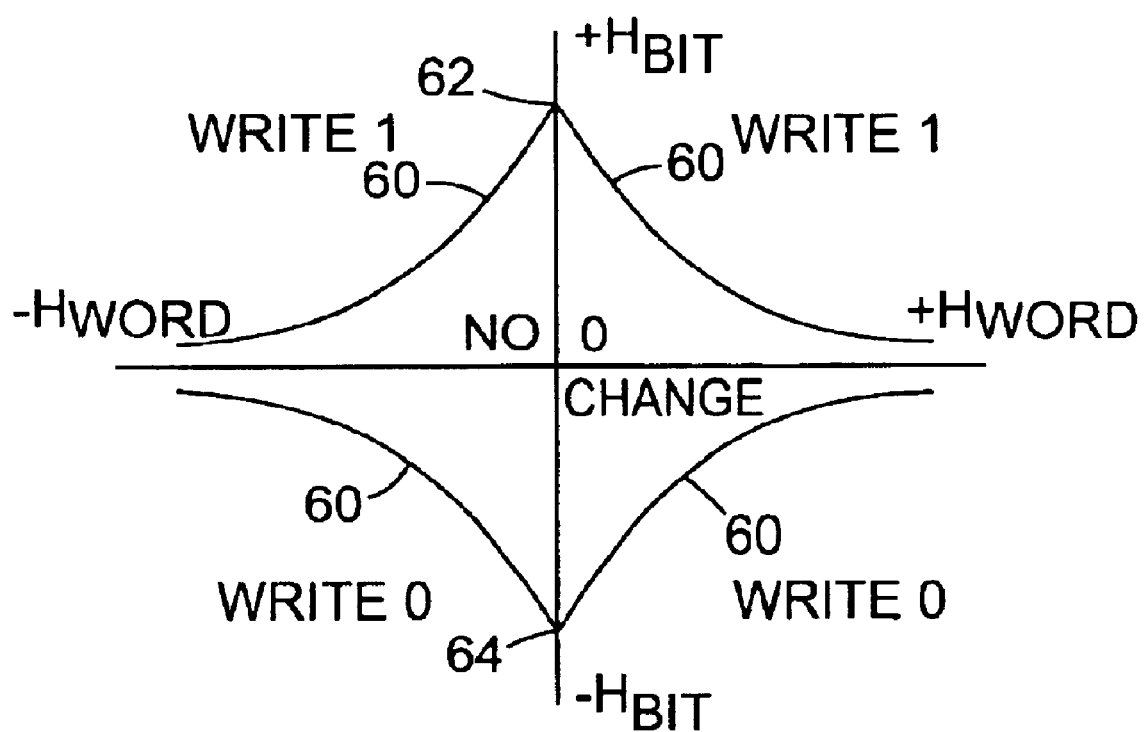
FIG. 4 is a graphical representation of an exemplary relationship of applied current versus writing effectiveness.

FIG. 4 is a graphical representation of an exemplary relationship of applied current versus writing effectiveness for a typical magnetic memory cell 14. FIG. 4 illustrates the relationship between the applied magnetic fields and the magnetic orientation of the magnetized free layer 20 of magnetic memory cell 14. In one embodiment, magnetic fields are applied to switch the magnetic orientation of the magnetized free layer 20. FIG. 4 illustrates a "no change" region" wherein the magnetic field resulting from the vector sum of the magnetic fields induced by the row and column currents ($I_x$ and $I_y$) are not sufficient to change the direction of the magnetization of free layer 20. The regions outside of the "no change" region are the regions wherein the effective magnetic fields will write either a logical "1" or a logical "0" into the selected magnetic memory cell 14. The boundary between the "no change" region and the writing regions is illustrated by four lines at 60. The half-select threshold is illustrated as the point where lines 60 intersect the +$H_{BIT}$ and the −$H_{BIT}$ axes. The magnetic memory cell 14 is half-selected when the word line current $I_x$ is zero and therefore $H_{WORD}$ is zero, and current $I_y$ for the bit line is sufficient to generate a magnetic field $H_{BIT}$ which has a magnitude greater than the intersection at point 62 in the positive direction or greater than point 64 in the negative direction. To simplify the description of the invention, FIG. 4 illustrates a symmetrical writing relationship between writing a logical "1" and writing a logical "0" to the selected magnetic memory cell 14 so that boundary lines 60 are symmetrically located with respect to the axes. Because such symmetry is not likely to exist in physical reality, the axes would actually be shifted from the centered position illustrated in FIG. 4.

Figure 5:
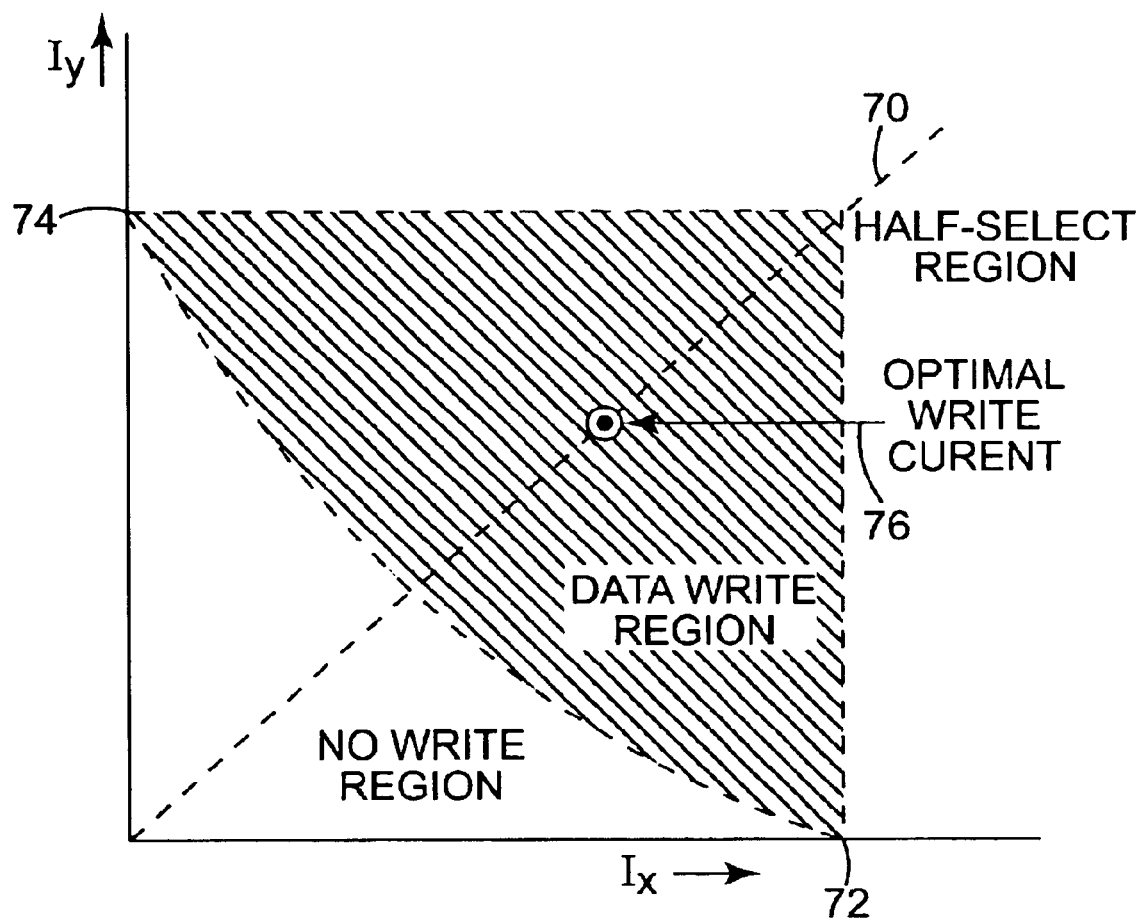
FIG. 5 is a graphical representation of optimized write current for a magnetic memory cell.

FIG. 5 is a graphical representation of optimized write current for a magnetic memory cell. As the first write conductor 16a current $I_x$ and the second write conductor 18a current $I_y$ are increased along line 70, the selected magnetic memory cell 14 passes through a no write region to a data write region. If the first write conductor 16a current $I_x$ is above the value indicated at 72, or if the second write conductor 18a current $I_y$ is above the value indicated at 74, half-selected magnetic memory cells 14 which are intersected by only first write conductor 16a or by only second write conductor 18a will be written. In one embodiment, the optimal reference write current value is indicated at point 76 along line 70, and the optimal reference write current values for $I_x$ and $I_y$ are the points along the $I_x$ and $I_y$ axes which correspond to point 76. The optimal write current value at point 76 ensures adequate half-select margins exist.

Figure 6:
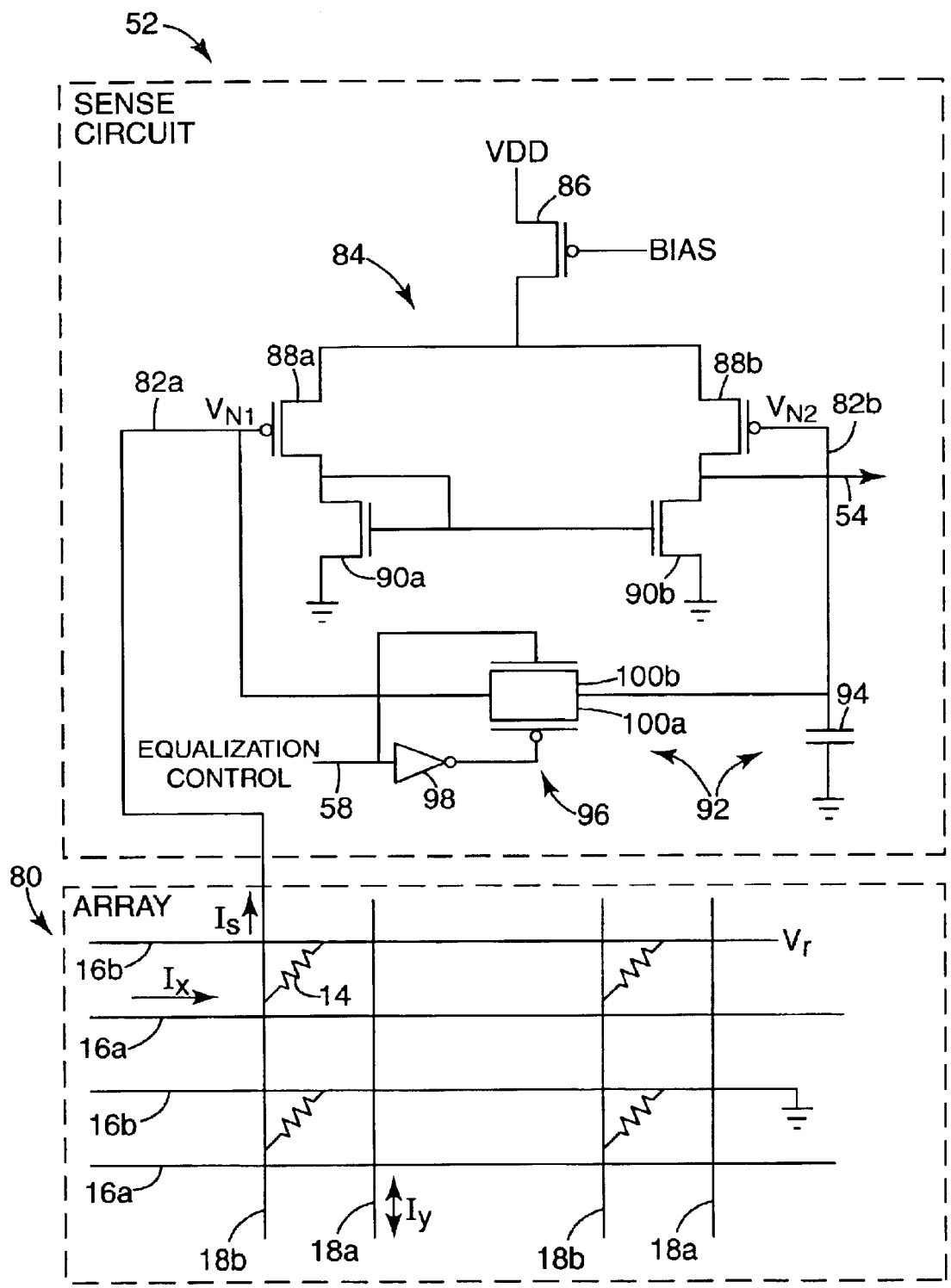
FIG. 6 is a diagram illustrating an exemplary embodiment of a sense circuit which detects a change between first and second resistive states of a memory cell.

FIG. 6 is a diagram illustrating an exemplary embodiment of a sense circuit 52 which detects a change between first and second resistive states of a memory cell 14. Memory cell 14 is located within array 12 where a selected first sense conductor 16b is coupled to the read voltage source $V_r$. Other unselected first sense conductors 16b are coupled to the ground potential. The selected second sense conductor 18b is coupled to sense circuit 52. Other unselected second sense conductors 18b are coupled to the read voltage source $V_r$ to minimize sneak current paths.

In the exemplary embodiment, the sense current flows through memory cell 14 and through a parallel combination of all unselected memory cells 14 which are connected to unselected word lines 16b. The memory cell 14 and the parallel combination of the unselected memory cells 14 form a voltage divider which is illustrated as a voltage sense circuit at 80. The voltage sense circuit 80 is coupled to the first input node 82a and provides a first input node voltage $V_{N1}$ to the first input node 82a.

An amplifier 84 having the first input node 82a and a second input node 82b is configured to compare the first input node voltage $V_{N2}$ to a second in put node voltage $V_{N2}$ at the second input node and provide an indication if the first input node voltage $V_{N1}$ is not equal to the second input node voltage $V_{N2}$. Amplifier 84 has includes a bias transistor 86 and input transistors 88a and 88b. Transistors 90a and 90b form a mirror current load circuit. The transistor 90a functions as a "reference" transistor and transistor 90b functions as a "slave" transistor that conducts a current directly proportional to the reference transistor 90a. Amplifier 84 has an output at 54 which indicates a result of comparing the first input node voltage $V_{N1}$ to the second input node voltage $V_{N2}$. If the first input node voltage $V_{N1}$ is greater than the second input node voltage $V_{N2}$, the voltage output at 54 will rise towards the supply voltage VDD as transistor 90b attempts to satisfy the mirror condition. If the first input node voltage $V_{N1}$ is less than the second input node voltage $V_{N2}$, the voltage output at 54 will fall towards the ground potential as transistor 90b attempts to satisfy the mirror condition. With this approach, amplifier 84 creates a voltage output at 54 which has a level which depends on the result of comparing the first input node voltage $V_{N1}$ to the second input node voltage $V_{N2}$. In other embodiments, additional regenerative logic can be included which is coupled to output 54 to help create definitive logic levels of "0" or "1".

In the exemplary embodiment, equalization circuit 92 is coupled between the first input node 82a and the second input node 82b and is configured to set the second input node voltage $V_{N2}$ to be equal to the first input node voltage $V_{N1}$ before the change between the first and the second resistive states is detected. The equalization circuit 92 includes a capacitor 94 which is coupled to the second input node 82b. The equalization circuit includes a switch 96. Switch 96 includes an inverter 98 and pass gate transistors 100a and 100b. Switch 96 is controlled by an equalization control line 58 which is provided by control system 30. Switch 96 has a closed position to set the second input node voltage $V_{N2}$ to be equal to the first input node voltage $V_{N1}$ before the change between the first and the second resistive states is detected. When switch 96 is in the closed position, capacitor 94 is charged to the first input node voltage $V_{N1}$. When switch 96 is in an open position, capacitor 94 maintains the $V_{N1}$ potential at the second input node while the amplifier 84 detects the change between the first and the second resistive states. Once the second input node voltage $V_{N2}$ is set to the same potential as the first input node voltage $V_{N1}$, when memory cell 14 changes resistive states, the first input node voltage $V_{N1}$ will increase or decrease relative to the second input node voltage $V_{N2}$, and amplifier 84 will provide the indication at output 54 that the memory cell 14 has changed between the first and the second resistive states.

In a first example embodiment, the first resistive state of memory cell 14 has a lower resistance than the second resistive state. In this example embodiment, memory cell 14 is storing the first resistive state. The array voltage $V_r$ is dropped by the resistance of memory cell 14 in the first resistive state and by the equivalent resistance of the parallel combination of the unselected memory cells 14 connected to the unselected sense word lines 16b. When switch 96 is in the closed position, capacitor 94 is charged to the first input node voltage $V_{N1}$ which corresponds to memory cell 14 storing the first resistive state. After switch 96 is in the open position, either one or both of the first current (illustrated as $I_x$), or the second current (illustrated as $I_y$), are conducted respectively through first write conductor 16a or second write conductor 18a at a level which is sufficient to change memory cell 14 from the first to the second resistive state.

Referring to FIG. 5, the level of currents $I_x$ and $I_y$ which are sufficient to change memory cell 14 between the first and the second resistive states occurs when currents $I_x$ and $I_y$ have sufficient magnitude to intersect in the "data write region". If currents $I_x$ and $I_y$ have too low of a value, they will intersect in the "no write region" and $I_x$ and $I_y$ will be insufficient to change memory cell 14 between the first and the second resistive states. If currents $I_x$ and $I_y$ are too high, half select writing can occur.

Referring to FIG. 6, when memory cell 14 changes to the second resistive state, the first input node voltage $V_{N1}$ decreases relative to the second input node voltage $V_{N2}$. The voltage output at 54 then decreases towards the ground potential thereby indicating that memory cell 14 has changed from the first to the second resistive state.

In a second example embodiment, the first resistive state of memory; cell 14 has a lower resistance than the second resistive state. In this example embodiment, memory cell 14 is storing the second resistive state. The array voltage $V_r$ is dropped by the resistance of memory cell 14 in the second resistive state and by the equivalent resistance of the parallel combination of the unselected memory cells 14 connected to the unselected sense word lines 16b. When switch 96 is in the closed position, capacitor 94 is charged to the first input node voltage $V_{N1}$ which corresponds to memory cell 14 storing the second resistive state. After switch 96 is in the open position, either one or both of the first current (illustrated as $I_x$), or the second current (illustrated as $I_y$), are conducted respectively through first write conductor 16a or second write conductor 18a at a level which is sufficient to change memory cell 14 from the first to the second resistive state. When memory cell 14 changes to the first resistive state, the first input node voltage $V_{N1}$ increases relative to the second input node voltage $V_{N2}$. The voltage output at 54 will increase towards the VDD supply potential thereby indicating that memory cell 14 has changed from the second to the first resistive state.

In other embodiments, memory cell 14 has a higher resistance when storing the first resistive state than when storing the second resistive state. In other embodiments, other approaches can be used for sense circuit 52 which provides the indication when selected memory cells 14 change between the first and the second resistive state. In one embodiment, only the first current $I_x$ is conducted through first write conductor 16a to change memory cell 14 between the first and the second resistive states. In one embodiment, only the second current $I_y$ is conducted through second write conductor 18a to change memory cell 14 between the first and the second resistive states. In one embodiment, both the first current $I_x$ and the second current $I_y$ are conducted respectively through the first write conductor 16a and the second write conductor 18a to, change memory cell 14 between the first and the second resistive states.

Figure 7:
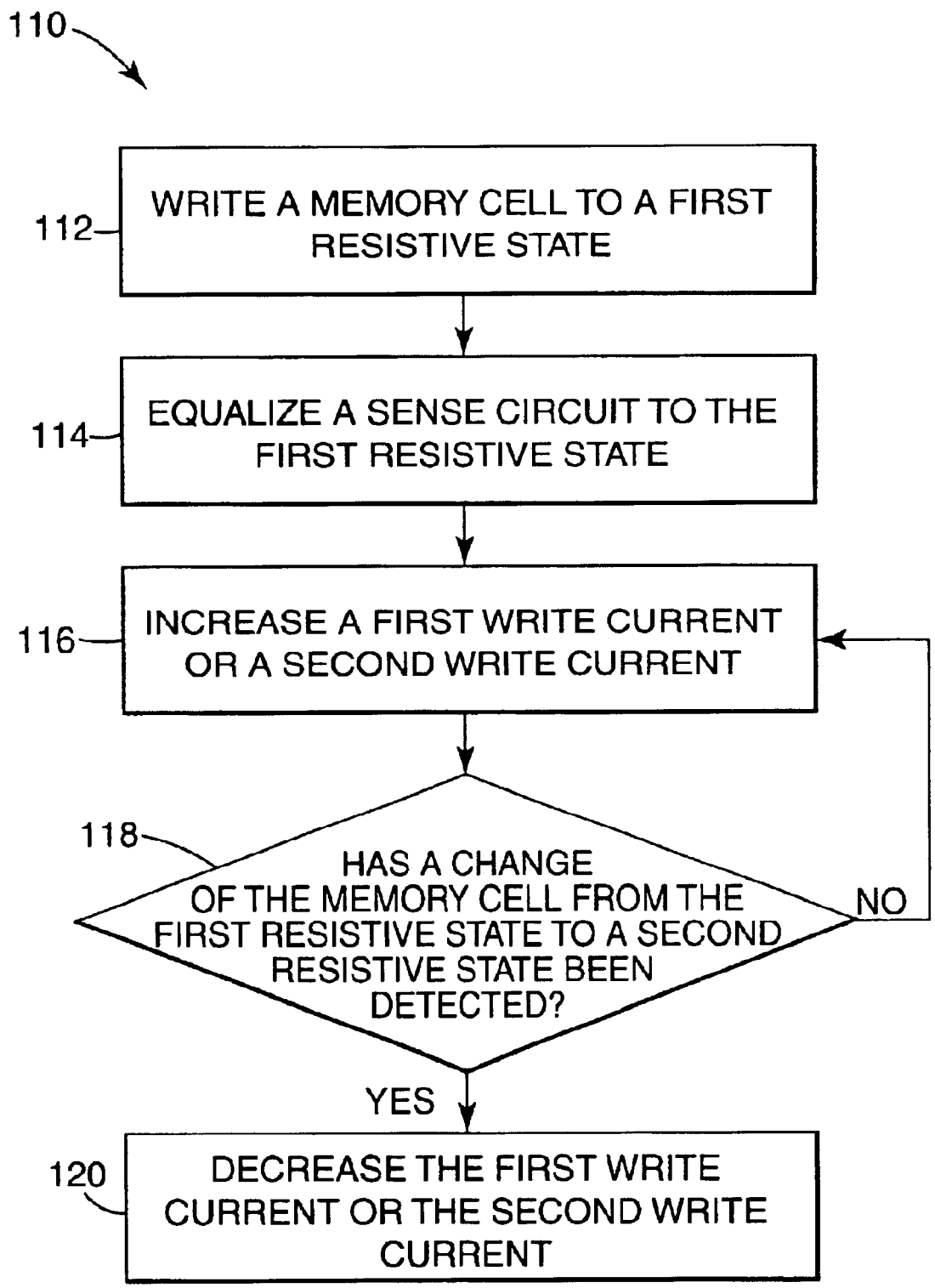
FIG. 7 is a flowchart illustrating an exemplary embodiment of a method of detecting a change from a first to a second resistive state of a memory cell.

FIG. 7 is a flowchart illustrating an exemplary embodiment of a method of detecting a change from a first to a second resistive state of a memory cell 14. The flow chart is illustrated at 110.

The method at 112 writes a memory cell 14 to a first resistive state. In other embodiments, the memory cell 14 can be written to a second resistive estate.

The method at 114 equalizes sense circuit 52 to the first resistive state. In the exemplary embodiment, equalization circuit 92 is configured to set the second input node voltage $V_{N2}$ to be equal to the first input node voltage $V_{N1}$ before the change from the first resistive state to the second resistive state is detected. Since memory cell 14 is storing the first resistive state, setting the second input node voltage $V_{N2}$ to be equal to the first input node voltage $V_{N1}$ equalizes the sense circuit 52 to the first resistive state. In other embodiments, other suitable approaches can be used to equalize sense circuit 52. In other embodiments, sense circuit 52 is equalized to the second resistive state.

The method at 116 increases a first write current or a second write current. In the exemplary embodiment, the first write current is the first current conducted through the first write conductor 16a and the second write current is the second current conducted through the second write conductor 18a. In various embodiments, the first current or the second current can be increased using any suitable approach. In one embodiment, the first current or the second current can be incrementally increased using a step approach wherein a suitable time is provided between steps to allow the memory cell 14 to change between the first resistive state and the second resistive state. In one embodiment, the first current or the second current can be increased continuously as a function of time.

The method at 118 detects a change of the memory cell 14 from the first resistive state to the second resistive state. In the exemplary embodiment, the change from the first resistive state to the second resistive state is detected by detecting a change in the sense current conducted by the first sense conductor 16b and the second sense conductor 18b through the memory cell 14. The sense current is conducted to sense circuit 52. Sense circuit 52 provides the indication at output 54 when the change in the sense current through the memory cell 14 is detected. In another embodiment, the method at 118 detects a change of the memory cell 14 from the second resistive state to the first resistive state. In other embodiments, the change between the first resistive state and the second resistive state can be detected using other suitable approaches.

If the change from the first resistive state to the second resistive state has not been detected, the method at 116 increases the first write current or the second write current. If the change from the first resistive state to the second resistive state has been detected, the method at 120 decreases the first write current or the second write current. In various embodiments, either the first write current or the second write current can be decreased to any suitable value using any suitable approach. In one embodiment, the suitable value is zero.

What is claimed is:

1. A magnetic memory, comprising:
   a memory cell which has first and second resistive states;
   first and second write conductors configured to conduct first and second currents to change the memory cell between the first and the second resistive states, wherein the first and the second write conductors are routed in first and second directions and intersect the memory cell;
   first and second sense conductors configured to conduct a sense current through the memory cell; and
   a sense circuit coupled to the second sense conductor configured to detect the change between the first and the second resistive states.

2. The magnetic memory of claim 1, wherein the sense circuit detects the change between the first and the second resistive states by detecting a change in the sense current through the memory cell which corresponds to the change between the first and the second resistive states.

3. The magnetic memory of claim 2, wherein the sense circuit comprises:
   a voltage sense circuit configured to convert the sense current to a first input node voltage at a first input node;
   an amplifier coupled between the first input node and a second input node configured to compare the first input node voltage to a second input node voltage at the second input node and provide an indication if the first input node voltage is not equal to the second input node voltage; and
   an equalization circuit coupled between the first input node and the second input node configured to set the second input node voltage to be equal to the first input node voltage before the change between the first and the second resistive states is detected.

4. The magnetic memory of claim 3, wherein the equalization circuit includes a capacitor coupled to the second input node.

5. The magnetic memory of claim 4, wherein the equalization circuit includes a switch configured to have a closed position to set the second input node voltage to be equal to the first input node voltage before the change between the first and the second resistive states is detected, and wherein the amplifier detects the change between the first and the second resistive states when the switch is in an open position.

6. The magnetic memory of claim 3, wherein the voltage sense circuit is a voltage divider coupled between the first input node and a ground potential.

7. The magnetic memory of claim 3, wherein the first current is conducted through the first write conductor or the second current is conducted through the second write conductor until the amplifier provides the indication that the memory cell has changed between the first and the second resistive states.

8. The magnetic memory of claim 7, wherein the first current is set at a constant level and the second current is increased until the amplifier provides the indication that the memory cell has changed between the first and the second resistive states, and wherein the first current and the second current are reduced after the amplifier provides the indication.

9. The magnetic memory of claim 7, wherein the second current is set at a constant level and the first current is increased until the amplifier provides the indication that the memory cell has changed between the first and the second resistive states, and wherein the first current and the second current are reduced after the amplifier provides the indication.

10. The magnetic memory of claim 7, wherein the first current is increased and the second current is increased until the amplifier provides the indication that the memory cell has changed between the first and the second resistive states, and wherein the first current and the second current are reduced after the amplifier provides the indication.

11. A magnetic memory sense system comprising:
    a magnetic memory which includes a memory cell having first and second resistive states, wherein the magnetic memory includes first and second write conductors routed in first and second directions which intersect the memory cell, and wherein the magnetic memory includes first and second sense conductors configured to conduct a sense current through the memory cell; and
    an amplifier circuit coupled to the second sense conductor and configured to detect a change between the first and the second resistive states of the memory cell by detecting a change in the sense current conducted by the first and the second sense conductor through the memory cell when the first and the second write conductor are conducting a first and a second current.

12. The sense system of claim 11, comprising a control system configured to change the memory cell between the first and the second resistive states by supplying a constant first current and increasing the second current until the memory cell changes between the first and the second resistive states, wherein the control system reduces the first and the second current after the memory cell has changed between the first and the second resistive states.

13. The sense system of claim 11, comprising a control system configured to change the memory cell between the first and the second resistive states by supplying a constant second current and increasing the first current until the memory cell changes between the first and the second resistive states, wherein the control system reduces the first and the second current after the memory cell has changed between the first and the second resistive states.

14. The sense system of claim 11, comprising a control system configured to change the memory cell between the first and the second resistive states by increasing the first and the second current until the memory cell changes between the first and the second resistive states, wherein the sense system reduces the first and the second current after the memory cell has changed between the first and the second resistive states.

15. A magnetic memory, comprising:
a memory cell which has parallel and anti-parallel magnetic states;
first and second write conductors configured to conduct first and second currents to change the memory cell between the parallel and the anti-parallel magnetic states, wherein the first and the second write conductors are routed in first and second directions and intersect the memory cell;
first and second sense conductors configured to conduct a sense current through the memory cell; and a sense circuit coupled to the second sense conductor configured to detect a change between the parallel and the anti-parallel magnetic states.

16. The magnetic memory of claim 15, wherein the sense circuit detects the change between the parallel and the anti-parallel magnetic states by detecting a change in the sense current through the memory cell which corresponds to the change between the parallel and the anti-parallel magnetic states.

17. The magnetic memory of claim 16, wherein the amplifier comprises:
a voltage sense circuit configured to convert the sense current to a first input node voltage at a first input node;
an amplifier having the first input node and a second input node configured to compare the first input node voltage to a second input node voltage at the second input node and provide an indication if the first input node voltage is not equal to the second input node voltage; and
an equalization circuit coupled between the first input node and the second input node configured to set the second input node voltage to be equal to the first input node voltage before the change between the parallel and the antiparallel magnetic states is detected.

18. The magnetic memory of claim 17, wherein the equalization circuit:
includes a capacitor coupled to the second input node.

19. The magnetic memory of claim 18, wherein the equalization circuit;
includes a switch configured to have a closed position to set the second input node voltage to be equal to the first input node voltage before the change between the parallel and the anti-parallel magnetic states is detected, and wherein the amplifier detects the change between the parallel and the antiparallel magnetic states when the switch is in an open position.

20. The magnetic memory of claim 17, wherein the voltage sense circuit is a voltage divider coupled between the first input node and a ground potential.

21. The magnetic memory of claim 17, comprising a control system configured to set the first current at a constant level and increase the second current until the amplifier provides the indication that the memory cell has changed between the parallel and the anti-parallel magnetic states, wherein the control system reduces the first current and the second current after the amplifier provides the indication.

22. The magnetic memory of claim 17, comprising a control system configured to set the second current at a constant level and increase the first current until the amplifier provides the indication that the memory cell has changed between the parallel and the anti-parallel magnetic states, wherein the control system reduces the first current and the second current after the amplifier provides the indication.

23. The magnetic memory of claim 17, comprising a control system configured to increase the first current and the second current until the amplifier provides the indication that the memory cell has changed between the parallel and the anti-parallel magnetic states, wherein the control system reduces the first current and the second current after the amplifier provides the indication.

24. A magnetic memory, comprising:
a first and second memory cell each having first and second resistive states;
a word line conductor pair extending in a first direction which intersects the first and the second memory cell, wherein the word line conductor pair:
includes a word write line and a word sense line, and wherein the word write line is configured to conduct a word write line current;
a first and second bit line conductor pair extending in a second direction which intersect the first and the second memory cells, wherein the first bit line conductor pair and the second bit line conductor pair each include a bit write line and a bit sense line;
a first sense circuit coupled to the bit sense line of the first bit line conductor pair and configured to detect a change between the first and the second resistive states of the first memory cell when the word write line of the word line conductor pair is conducting the word write line current and the bit write line of the first bit line conductor pair is conducting a first bit write line current, wherein the first sense circuit detects a change in a first bit sense current conducted through the first memory cell which corresponds to the change between the first and the second resistive states of the first memory cell; and
a second sense circuit coupled to the bit sense line of the second bit line conductor pair and configured to detect a change between the first and the second resistive states of the second memory cell when the word write line of the word line conductor pair is conducting the word write line current and the bit write line of the second bit line conductor pair is conducting a second bit write line current, wherein the second sense circuit detects a change in the second bit sense current conducted through the second memory cell which corresponds to the change between the first and the second resistive states of the second memory cell.

25. The magnetic memory of claim 24, comprising a control system configured to set the word write line current at a constant level and increase the bit write line current until the first sense circuit detects the change between the first and the second resistive states of the first memory cell and increase the second bit write line current until the second sense circuit detects the change between the first and the second resistive states of the second memory cell, wherein the control system reduces the first bit write line current after the first sense circuit detects the change between the first and the second resistive states of the first memory cell and reduces the second bit write line current after the second sense circuit detects the change between the first and the second resistive states of the second memory cell, and wherein the control system reduces the word write line current after both the first and the second sense circuits have detected the change between the first and the second resistive states of the first and the second memory cells.

26. The magnetic memory of claim 24, comprising a control system configured to set the first bit write line current and the second bit write line current at a constant level and increase the word write line current until both of the first and the second sense circuits have detected the change between the first and the second resistive states of the first and the second memory cells, wherein the control system reduces the first bit write line current after the first sense circuit has detected the change between the first and the second resistive states of the first memory cell and reduces the second bit write line current after the second sense circuit has detected the change between the first and the second resistive states of the second memory cell.

27. The magnetic memory of claim 24, comprising a control system configured to increase the word write line current and increase the first bit write line current until the first sense circuit detects the change between the first and the second resistive states of the first memory cell and increase the second bit write line current until the second sense circuit detects the change between the first and the second resistive states of the second memory cell, wherein the control system reduces the first bit write line current after the first sense circuit detects the change between the first and the second resistive states of the first memory cell and reduces the second bit write line current after the second sense circuit detects the change between the first and the second resistive states of the second memory cell, and wherein the control system reduces the word write line current after both of the first and the second sense circuits have detected the change between the first and the second resistive states of the first and the second memory cells.

28. A magnetic memory, comprising:
a memory cell which has first and second resistive states;
first and second write conductors configured to conduct first and second currents to change the memory cell between the first and the second resistive states, wherein the first and the second write conductors are routed in first and second directions and intersect the memory cell;
first and second sense conductors configured to conduct a sense current through the memory cell; and
sense means to detect the change between the first and the second resistive states.

29. The magnetic memory of claim 28, wherein the sense means detects the change between the first and the second resistive states by detecting a change in the sense current through the memory cell which corresponds to the change between the first and the second resistive states; and wherein the sense means includes:
converter means to convert the sense current to a first input node voltage;
compare means to compare the first input node voltage to a second input node voltage and provide an indication if the first input node voltage is not equal to the second input node voltage; and
equalization means coupled between the first input node and the second input node configured to set the second input node voltage to be equal to the first input node voltage before the change between the first and the second resistive states is detected.

30. A method of detecting a change between a first and a second resistive state of a memory cell in a magnetic memory storage device which includes first and second write conductors which intersect the memory cell, comprising:
conducting first and second currents through the first and the second write conductors; and
detecting a change between the first and the second resistive states by detecting a change in a sense current conducted through the memory cell, wherein the change corresponds to the change between the first and the second resistive states.

31. The method of claim 30, further comprising:
wherein detecting the change comprises:
converting the sense current to a first input node voltage;
comparing the first input node voltage to a second input node voltage; and
providing an indication if the first input node voltage is not equal to the second input node voltage,
wherein comparing the first input node voltage to the second input node voltage comprises setting the second input node voltage to be equal to the first input node voltage before the first input node voltage is compared to the second input node voltage; and
wherein conducting the first and the second currents through the first and the second write conductors comprises:
setting the first current at a constant level;
increasing the second current;
providing the indication when the memory cell has changed between the first and the second resistive states; and
reducing the first current and the second current after the indication is provided.

* * * * *